United States Patent
Scheppler et al.

(10) Patent No.: US 8,533,563 B2
(45) Date of Patent: Sep. 10, 2013

(54) MEMORY READ-OUT

(75) Inventors: Michael Scheppler, Munich (DE); Helmut Schwalm, Karlskron (DE); Doris Keitel-Schulz, Hoehenkirchen (DE); Xavier Veredas-Ramirez, Munich (DE); Detlev Richter, Munich (DE)

(73) Assignee: Qimonda AG, Munich (DE)

( * ) Notice: Subject to any disclaimer, the term of this patent is extended or adjusted under 35 U.S.C. 154(b) by 1003 days.

(21) Appl. No.: 12/059,796

(22) Filed: Mar. 31, 2008

(65) Prior Publication Data

US 2009/0244973 A1  Oct. 1, 2009

(51) Int. Cl.
*G11C 29/00* (2006.01)

(52) U.S. Cl.
USPC ........... 714/763; 365/185.09; 365/185.22; 365/185.24

(58) Field of Classification Search
USPC ............ 714/763, 772; 365/185.09, 185.22, 365/185.24
See application file for complete search history.

(56) References Cited

U.S. PATENT DOCUMENTS

| | | | |
|---|---|---|---|
| 6,279,133 B1* | 8/2001 | Vafai et al. | 714/763 |
| 7,158,418 B2* | 1/2007 | Chae et al. | 365/185.23 |
| 7,844,879 B2* | 11/2010 | Ramamoorthy et al. | 714/763 |
| 2004/0008567 A1* | 1/2004 | Furuyama | 365/233 |
| 2005/0157555 A1* | 7/2005 | Ono et al. | 365/185.18 |
| 2005/0268208 A1* | 12/2005 | Shimizume et al. | 714/763 |
| 2007/0002611 A1* | 1/2007 | Ye et al. | 365/177 |
| 2007/0033490 A1* | 2/2007 | Moosrainer et al. | 714/763 |
| 2007/0220400 A1* | 9/2007 | Toda et al. | 714/763 |
| 2007/0226590 A1* | 9/2007 | Nagai | 714/763 |
| 2008/0082897 A1* | 4/2008 | Brandman et al. | 714/763 |
| 2008/0137413 A1* | 6/2008 | Kong et al. | 365/185.03 |
| 2008/0151617 A1* | 6/2008 | Alrod et al. | 365/185.2 |
| 2008/0201625 A1* | 8/2008 | Mulligan | 714/758 |
| 2009/0013231 A1* | 1/2009 | Lam | 714/746 |
| 2011/0103145 A1* | 5/2011 | Sarin et al. | 365/185.03 |
| 2011/0185261 A1* | 7/2011 | Toda | 714/763 |

* cited by examiner

*Primary Examiner* — Yolanda L Wilson
(74) *Attorney, Agent, or Firm* — John S. Economou

(57) ABSTRACT

A memory system having a plurality of memory cells for storing payload data and redundancy data. The memory system having a read-out circuit configured to read-out a status of the plurality of memory cells, the read-out status having payload data, redundancy data and associated reliability information. Moreover, the memory system has a data processor configured to derive the payload data from the read-out status using the reliability information.

3 Claims, 20 Drawing Sheets

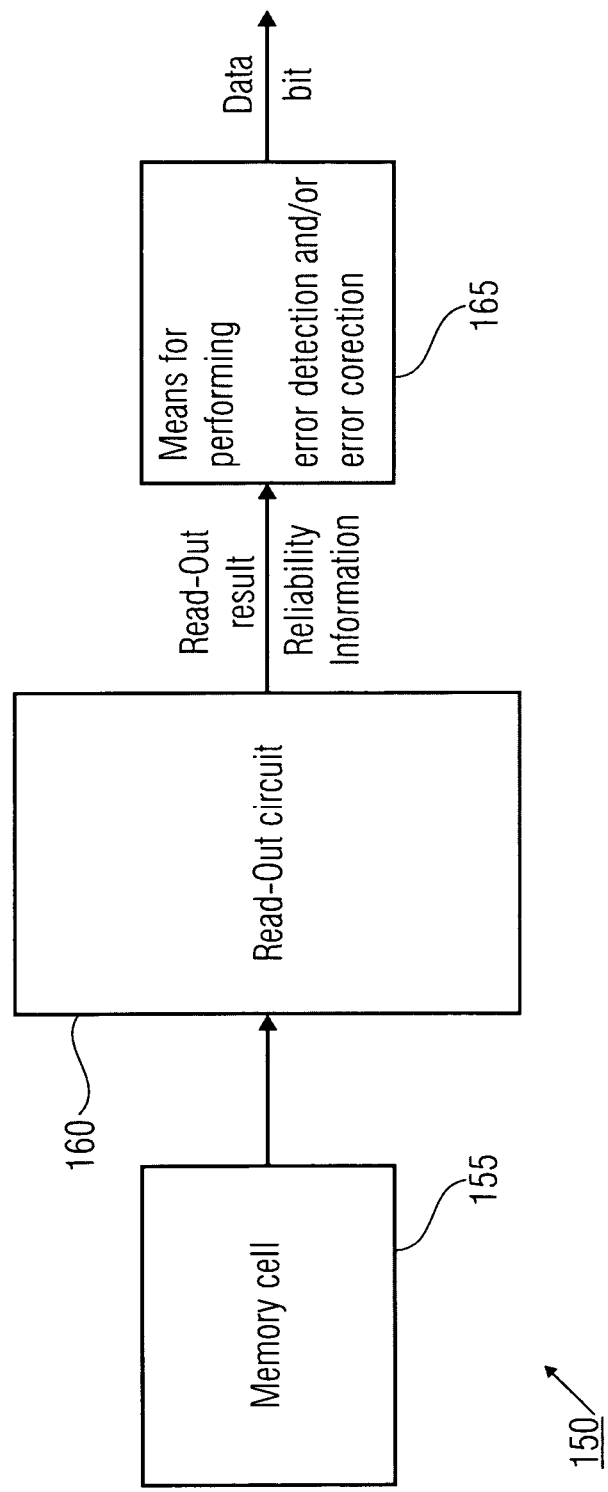

MEMORY READ-OUT

BACKGROUND

The present invention relates to a memory system, a circuit comprising a memory cell, a flash memory device and a memory device.

BRIEF DESCRIPTION OF THE DRAWINGS

In the following, some embodiments of the invention will be detailed using the accompanying figures, in which:

FIG. 1c shows an embodiment of a circuit.

DETAILED DESCRIPTION OF ILLUSTRATIVE EMBODIMENTS

Figure 1A:
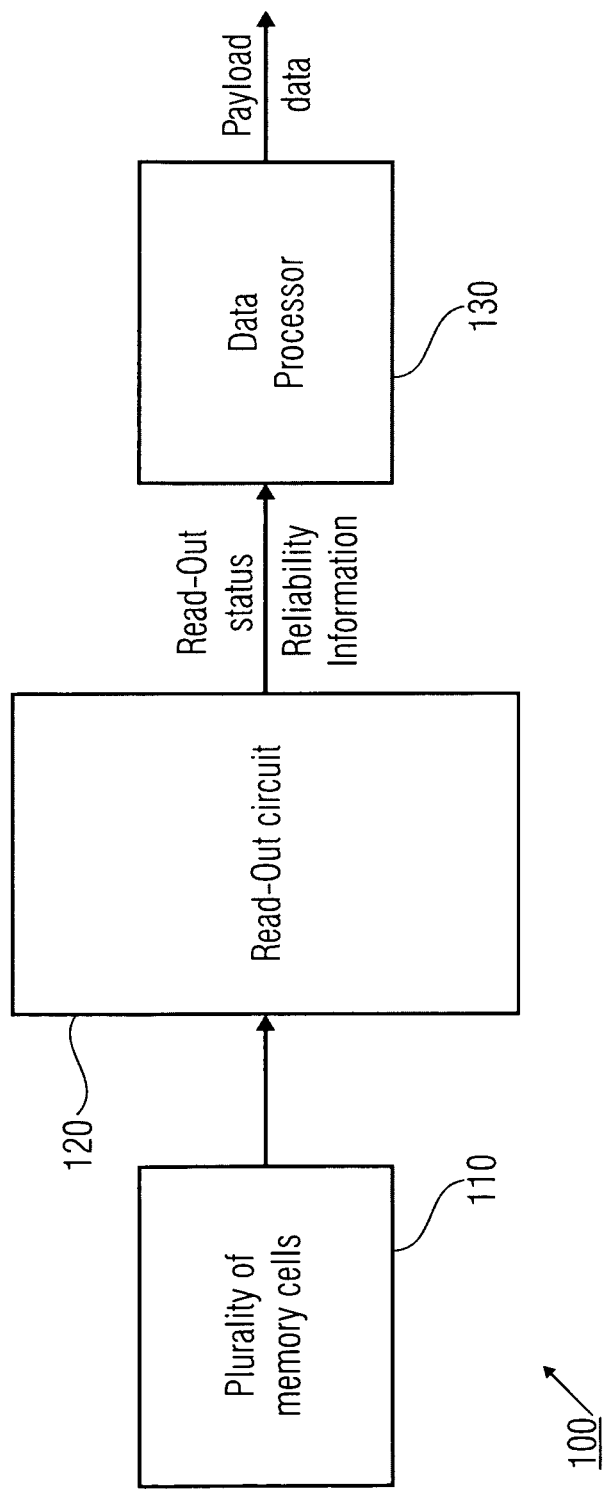
FIG. 1a shows an embodiment of a memory system.

FIG. 1 shows an embodiment of a memory system 100 comprising a plurality of memory cells 110 for storing payload data and redundancy data. The memory system 100 further comprises a read-out circuit 120 configured to read-out a status of the plurality of memory cells, the read-out status comprising payload data, redundancy data and associated reliability information. Moreover, the memory system 100 comprises a data processor 130 configured to derive the payload data from the read-out status using the reliability information.

The plurality of memory cells 110 can comprise non-volatile memory cells. In particular, the plurality of memory cells 110 may comprise NAND- or NOR-Flash memory cells. Embodiments are not limited to non volatile memories and other memory architectures may also be utilized. The read-out circuit 120 may comprise a plurality of sense amplifiers configured to sense the memory cells wherein the read-out circuit 120 can be configured to read-out a status of a memory cell by comparison of an output of a sense amplifier to a threshold.

In some embodiments, the read-out circuit 120 can be configured to sequentially change a word line voltage according to a predetermined manner. In such a case, the read-out circuit 120 may read-out a status of a memory cell by determining an output of a sense amplifier with varying word line voltage and deriving the status from the value of the word line voltage at a time when a comparison between the output of the sense amplifier and the threshold fulfills a predefined relationship. Furthermore, the read-out circuit 120 can be configured to adapt the predetermined manner to an age of the memory cell. Aging effects of memory cells may be partly or completely compensated by embodiments. A detailed embodiment in this regard is described below.

For example, the read-out circuit 120 may comprise a counter for counting incremental word line voltage changes and the read-out circuit 120 can be configured to determine the reliability information based on a count. An output of a sense amplifier may correspond to a bit line voltage and the read-out circuit 120 may be configured to determine the reliability information from the current value of the count at the time when the bit line voltage reaches the threshold, with the threshold representing the above-mentioned predetermined manner. An even more detailed description is presented with regard to FIG. 6.

Further, the plurality of memory cells 110 may comprise multi level memory cells. In particular, the plurality of memory cells 110 may comprise $2^n$-level memory cells and the read-out circuit 120 may be configured to read-out an m-bit value, with m being equal to n+1 or greater, per memory cell. The read-out circuit 120 may be configured to provide the read-out status of the plurality of memory cells 110 along with a plurality of reliability information associated with the read-out status as a plurality of binary values.

In embodiments, the data processor 130 can be configured to derive the payload data by performing an error detection and/or an error correction by combining the read-out status and the associated reliability information. The data processor 130 can be further configured to derive the payload data by performing error detection and/or error correction by combining a plurality of read-out states, an associated plurality of reliability information and a plurality of redundancy data.

In embodiments, the memory system 100 may further comprise an encoder to receive the payload data and to derive the redundancy data associated with the payload data based on the payload data and an encoding rule. The data processor 130 can be configured to use a maximum likelihood estimation rule, a linear block correction code and/or a Trellis decoding scheme to determine the payload data.

Figure 1B:
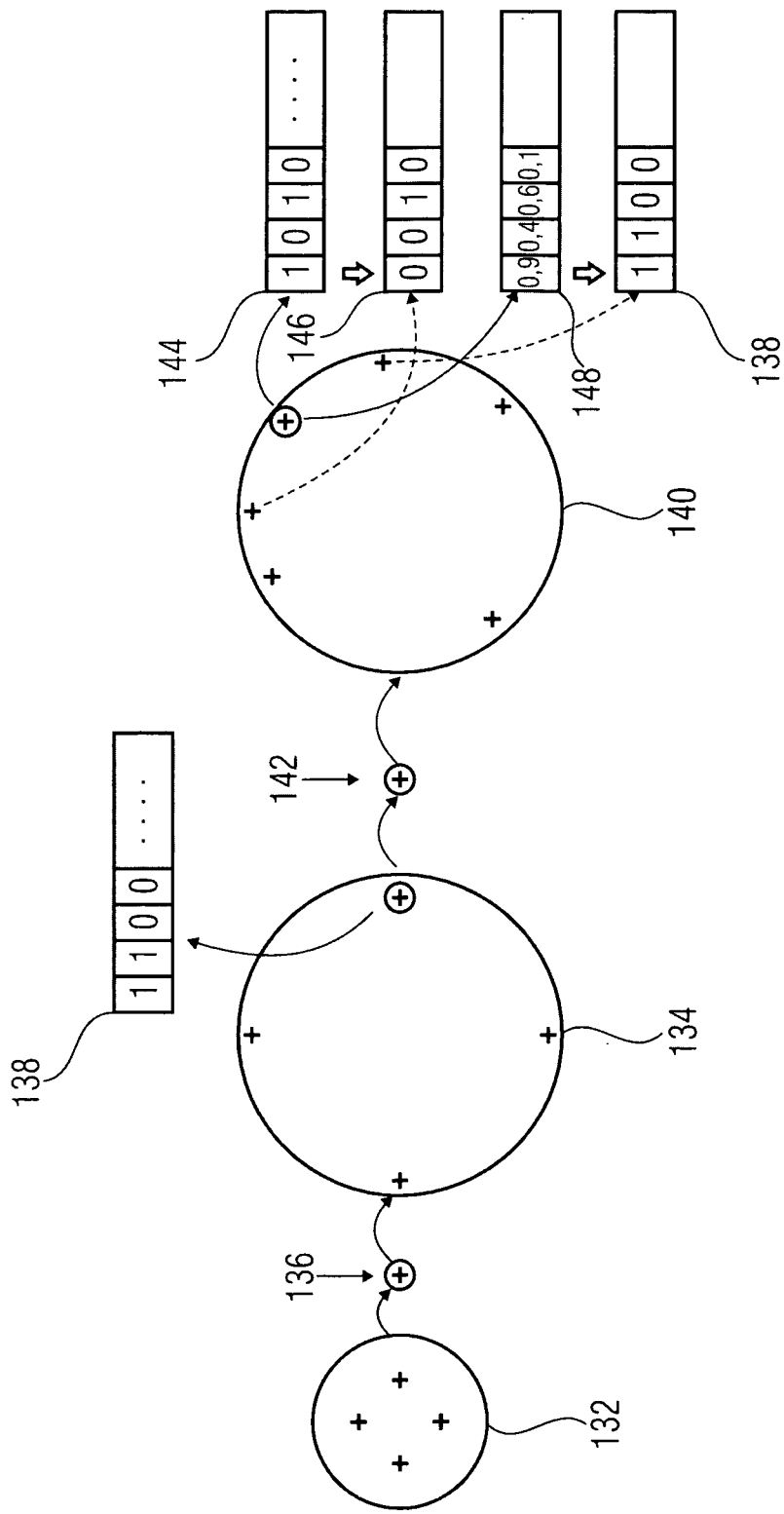
FIG. 1b illustrates an error correction by an embodiment.

FIG. 1b illustrates an error correction by an embodiment. FIG. 1b shows a set 132 of payload data which is mapped to a set 134 of valid codewords according to an encoding rule, wherein the mapping may include addition of redundancy data 136. Accordingly, a codeword would refer to a higher dimension than payload data, indicated in FIG. 1b by the set 134 of codewords being larger than the set of payload data. In other words, a payload data is unambiguously mapped to a codeword, and the codeword may have more digits than the payload data. Thus, even though the number of different payload data matches the number of different valid codewords, due to the unambiguousness, the dimension of a codeword may be larger. Therefore, with respect to the dimension of the set of codewords not all possible codewords are used, typically a certain distance, e.g., the so-called Hamming distance, lies between two valid codewords.

In an embodiment of a memory system 100 said valid codewords can be stored in the plurality of memory cells 110, comprising the payload data and the redundancy data. The read-out circuit 120 is configured to read-out a status of the plurality of memory cells, the read-out status comprising the payload data, the redundancy data and associated reliability information. The read-out status can be mapped to a valid codeword. In accordance with some embodiments, this mapping is performed by use of the reliability information. The thus derived codeword unambiguously indicates the payload data of interest. However, according to a comparison embodiment also discussed below, the reliability information is not used. Rather the mapping from the read-out status to the codeword is performed merely by quantization, such as by evaluating a bit line voltage versus a threshold yielding a binary codeword, with in case of a resulting invalid codeword, deriving a valid codeword from the invalid codeword merely by use of knowledge exploiting the redundancy within the codeword introduced by the redundancy data 136.

Multiple effects, as, for example, noise, electrical disturbances, aging of the memories or memory cells etc., may cause a date of such a memory system being corrupted or erroneous as already noted above.

Assume for example that a valid binary codeword 138 was written to the plurality of memory cells 110. A read-out of the same results, by use of quantization or thresholding, to a detected codeword 144. Due to the above-mentioned corruption, same may be invalid, i.e., it does not lie in the set 134 of valid codewords. Error correction exploiting the redundancy 136 may be carried out by choosing a valid codeword 146, which lies closest to the codeword 144 within the set 140 of read-out statuses. In the example depicted in FIG. 1b this is illustrated by the first digits of the codewords 144 and 146 being different, supposing that the codeword 146 is a valid codeword from the set 134 of valid codewords. However, according to FIG. 1b, the closest valid codeword 146 does not match the codeword 138 which was actually written to the plurality of memory cells 110, therefore causing an error.

In embodiments the data processor 130 is configured to derive the payload data from the read-out status using the reliability information. In FIG. 1b the read-out status of the embodiment is given by the codeword 148, which has reliability information in terms of digits with soft information, here exemplified using decimal values between 0 and 1. It is assumed that the closer a value to either 0 or 1 the lower the error ratio, when estimating said value. A decision threshold, which is used to decide the soft information digits into binary digits may in this example be at 0.5. In other words, the closer a value to 0.5 the more insecure an estimation about the associated binary digit, which was actually stored.

The data processor 130 may be able to determine, that the first digit 0.9 of codeword 148 has a high probability of being a "1", where the second and third digits, 0.4 and 0.6, have rather high probabilities of being incorrect "0" and "1", since they are rather close to the decision threshold 0.5. Consequently, the data processor 130 may flip the second and third digits rather than the first digit, correctly deciding on the codeword 138, which was actually stored. Thus, the probability of deriving the correct codeword and thus, the correct payload data, is increased relative to the case of correcting the invalid codeword merely by use of redundancy data.

FIG. 1c shows an embodiment of a circuit 150 comprising a memory cell 155 for storing a data bit and a read-out circuit 160 for deriving a sense result from the memory cell 155, the sense result indicating a read-out result along with a reliability information for said read-out result. Furthermore, the circuit 150 comprises a means 165 for performing an error detection and/or error correction based on the reliability information and the read-out results to obtain the data bit.

In embodiments the memory cell 155 may comprise a non volatile memory cell. The means 165 for performing can be configured to use a Trellis decoding scheme to obtain the data bit. The means 165 for performing may be configured to use a linear block correction code.

Embodiments may carry out a method for reading a data bit from a memory cell, comprising the steps of storing the data bit, deriving a read-out result from the memory cell, and determining a reliability information along with said read-out result. Embodiments may further carry out a step of performing an error detection and/or error correction based on the read-out result and the reliability information to obtain the data bit.

Figure 1D:
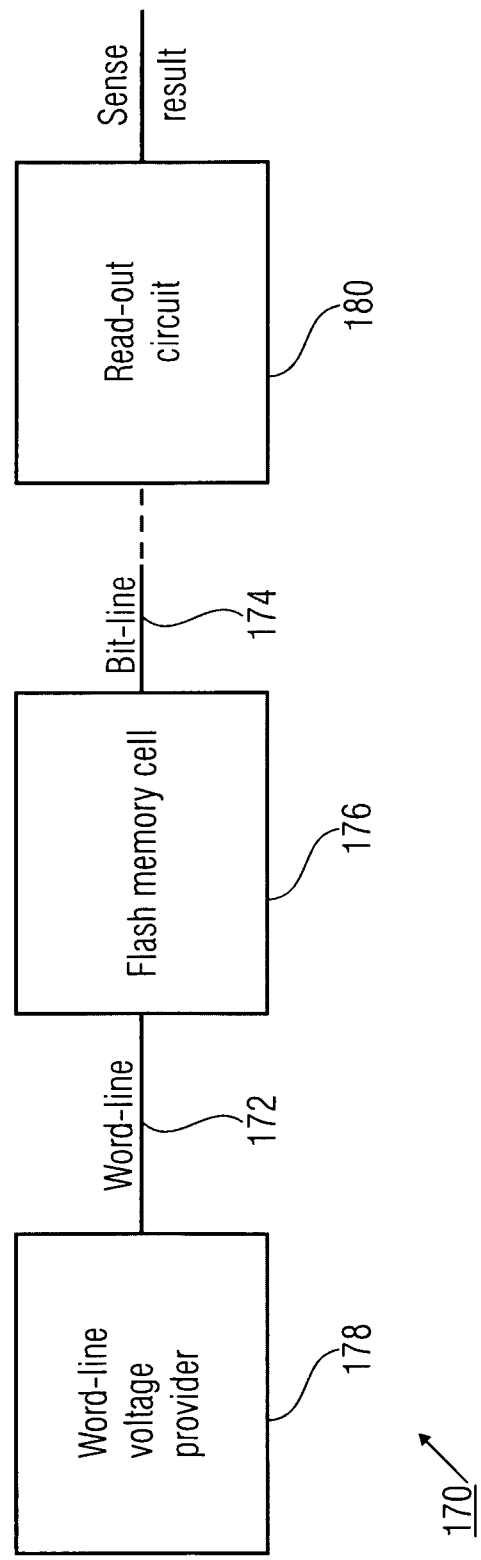
FIG. 1d shows an embodiment of a flash memory device.

FIG. 1d illustrates an embodiment of a flash memory device 170. The flash memory device 170 comprises a word line 172, a bit line 174 and a flash memory cell 176 coupled to the word line 172 and to the bit line 174. Furthermore, the flash memory device 170 comprises a word line voltage provider 178 being operative to sequentially vary a word line voltage on the word line 172. Moreover, the flash memory device 170 comprises a read-out circuit 180 being connectable to the bit line 174 and being configured to provide a sense result indicating a read-out result for the flash memory cell 176 along with a corresponding reliability information based on the word line voltage and a bit line voltage on the bit line 174. In FIG. 1d the bit line 174 is partly depicted as a solid line indicating the bit line 174 is coupled to the flash memory cell 176. The bit line 174 has a dotted line part, which shall indicate that the bit line 174 may not be permanently connected to the read-out circuit 180.

In embodiments the word line voltage provider 178 may further comprise an incrementor for incrementing a word line voltage and the read-out circuit 180 may be configured to determine the sense result dependent on the word line voltage.

In embodiments the flash memory cell 176 and the read-out circuit 180 may be commonly integrated on a die, and the read-out circuit 180 may be configured to provide the sense result such that the sense result is receivable at an external contact of the die.

Figure 1E:
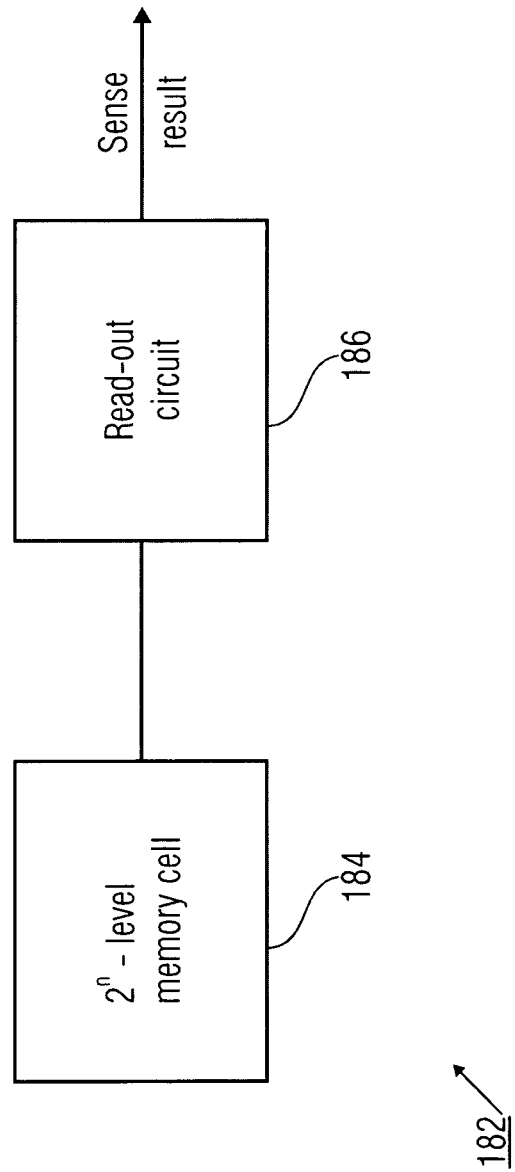
FIG. 1e shows an embodiment of a memory device.

FIG. 1e shows an embodiment of a memory device 182 comprising a $2^n$-level memory cell 184 and a read-out circuit 186 configured to provide a sense result from the $2^n$-level memory cell 184, the sense result having a resolution greater than or equal to $2^{n+1}$.

In embodiments the $2^n$-level memory cell and the read-out circuit 186 may be commonly integrated on a die, and a read-out circuit 186 may be configured to provide a sense result such that the sense result is receivable at an external contact of the die.

Figure 1F:
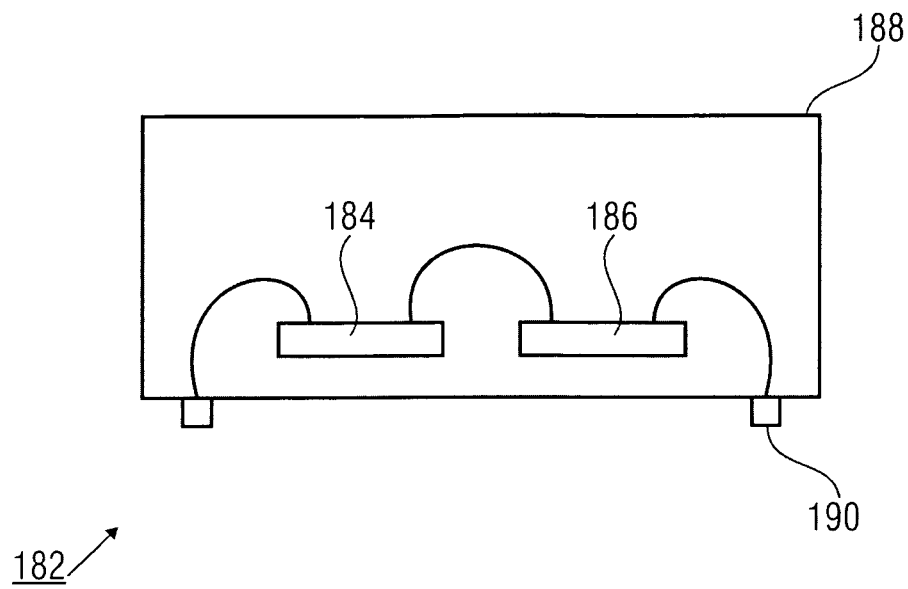
FIG. 1f shows an embodiment of a flash memory device in a housing.

FIG. 1f illustrates an embodiment of a memory device 182, wherein the $2^n$-level memory cell 184 and the read-out circuit 186 are integrated in a housing 188. In the embodiment shown in FIG. 1f the sense result is connectable at an external contact 190 of the housing 188, a connection as, e.g., a bond wire 192 may be utilized to couple the external contact 190 and the read-out circuit 186.

Figure 1G:
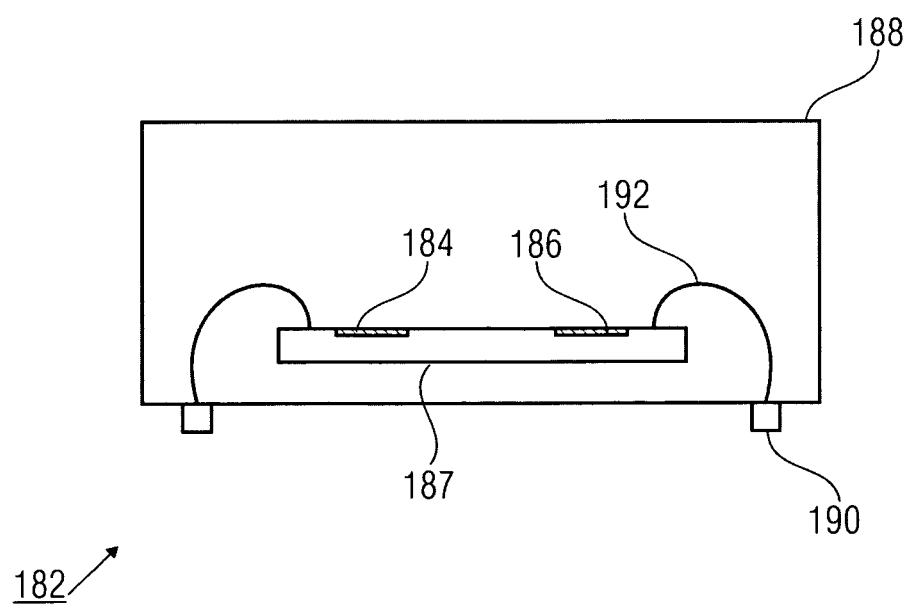
FIG. 1g shows another embodiment of a flash memory device in a housing.

Another embodiment of a memory device 182 is depicted in FIG. 1g. In FIG. 1g, the $2^n$-level memory cell 184 and the read-out circuit 186 are commonly integrated on a die 187. The read-out circuit 186 is configured to provide the sense result such that the sense result is receivable at the external contact 190. Moreover, the die 187 is housed by a housing 188 and the external contact 190 is either contactable from the outside of the housing 188 or a bond wire 192 may be wire-bonded to the external contact 190.

Figure 2A:
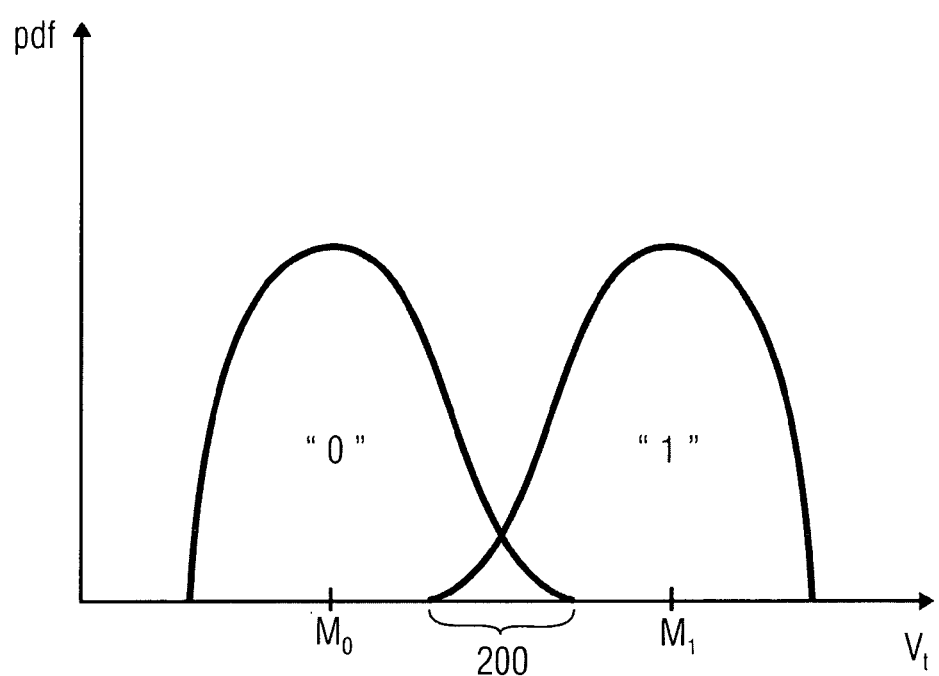
FIG. 2a illustrates a value range of an output of a single level memory cell.

FIG. 2a illustrates an example of a probability density function (PDF=Probability Density Function) of a read-out or sense result of a single level memory cell (SLC=Single Level memory Cell). FIG. 2a shows a viewgraph, having a bit line voltage on the abscissa and the according PDF on the ordinate. As can be seen from the viewgraph a single level memory cell may store one bit, respectively two different states per memory cell. The bit line voltages, as they e.g. occur at the output of sense amplifiers show that their value range is not binary, but, e.g., rather Gaussian distributed around two mean values, which are indicated by $M_0$ and $M_1$ in FIG. 2a. From region 200 in FIG. 2a it can be seen, that the two PDFs of the bit line voltages of the two states overlap, and therewith errors may be introduced. In other words, if the output of a sense amplifier is in the region 200, the output is not unambiguous anymore, as bit line voltages in this range can not be associated unambiguously to one of the two possible states for the case of an SLC.

Figure 2B:
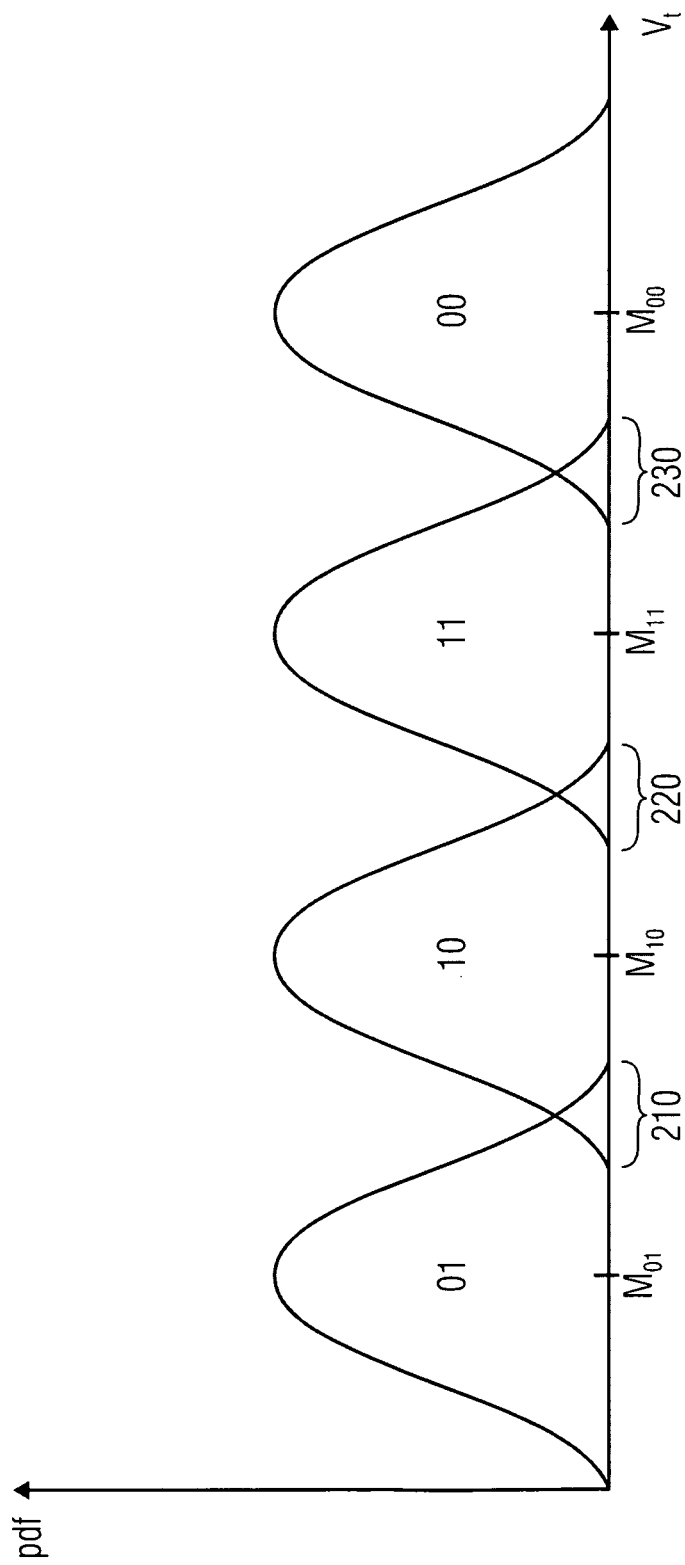
FIG. 2b illustrates a value range of an output of a multi level memory cell.

FIG. 2b illustrates a similar scenario for a multi level memory cell (MLC=Multi Level memory Cell). FIG. 2b illustrates a similar viewgraph as FIG. 2a, i.e., having a bit line voltage on the abscissa and a PDF on the ordinate. The multi level cell assumed for FIG. 2b may store two bits per memory cell or may have four different states according to the combinations of 01, 10, 11 or 00. Accordingly, FIG. 2b shows four mean values $M_{01}$, $M_{10}$, $M_{11}$ and $M_{00}$ of the four PDFs being associated with the four states. The possible bit line voltages $V_t$ are distributed around these mean values, for example in a Gaussian manner. As can be seen from the regions 210, 220 and 230, errors may also be introduced for the multi level cell.

Trends and development may be regarded likely to move towards storing more than one or two bits per cell, for example, three or four or even more. Increasing the number of bits per cell may also increase the likelihood of appearing errors, for example, during a read process, and therefore a momentum for much more powerful error correction methodologies may be created. A similar tendency can be observed with respect of structure sizes. The smaller structure sizes of the flash process technology, the higher a failure probability may be. Storing more than one bit per cell may, for example, by means of multilevel representation, reduce margins between different level distributions.

Figure 3A:
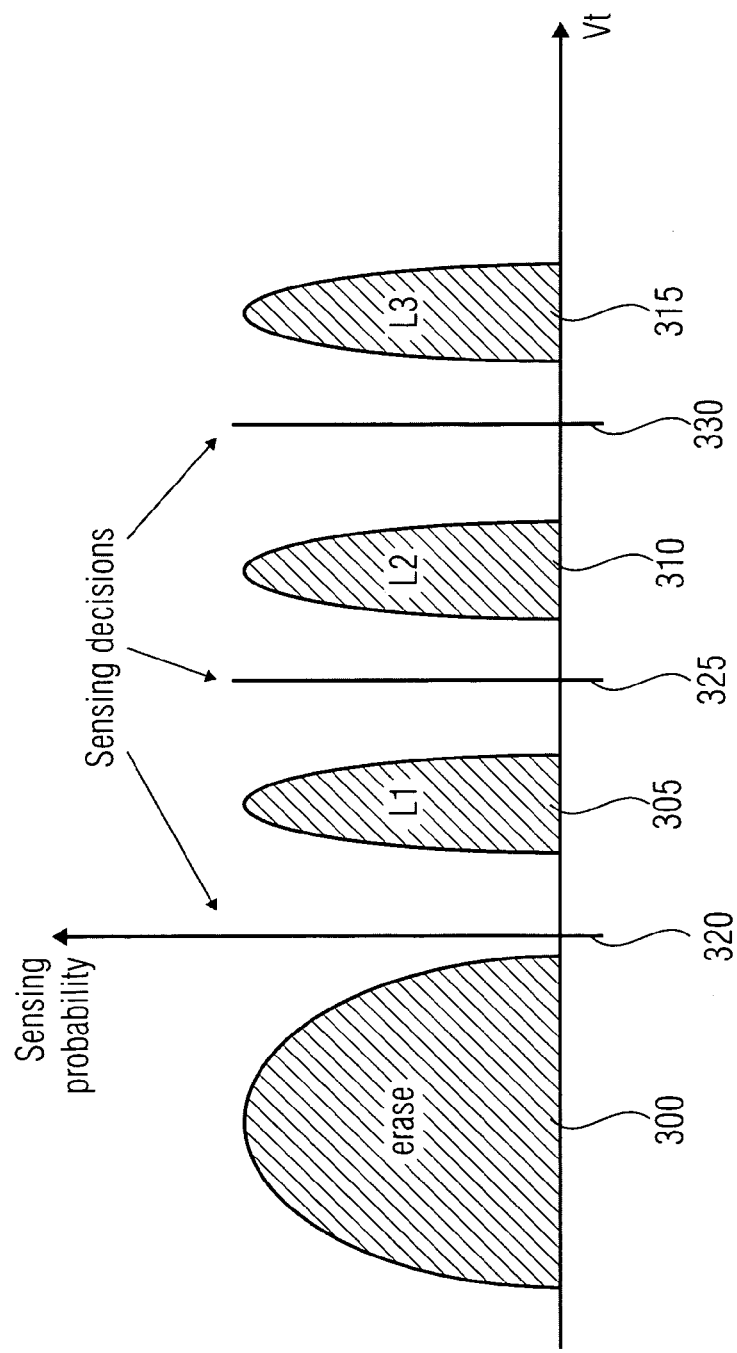
FIG. 3a illustrates a detection of an outcome of a multi level memory cell with an embodiment.

FIG. 3a shows another viewgraph having bit line voltage $V_t$ on the abscissa and sensing probability or the PDF on the ordinate. FIG. 3a shows four regions, 300, 305, 310 and 315. The regions are also labeled with "erase", "L1", "L2" and "L3". Between these regions vertical bars indicate thresholds for sensing decisions, i.e., the bars 320, 325 and 330 indicate the levels at which an output of a sense amplifier would determine a different detector value.

For example, for writing to such a multi level cell, a multitude of target levels for storage may be distinguished in the analog domain. As indicated in FIG. 3a, multitudes of sensing thresholds for separation of the different decision regions may be utilized. As also indicated in FIG. 3a there may be windows or margins between the targets to enable a safe classification at read access. In other words decision regions may not by default overlap there may be regions, e.g., in terms of guard regions, in between. However, errors introduced by the above described effects may be introduced.

Within the scope of a read sensor there is a statistical variation of the read levels, as it was described above, for example, assuming a Gaussian distributed error, which can be superimposed to the bit line voltage. During the write process, an expectation may only be a compact level distribution around the desired target levels. During aging of a memory cell, a widening and movement of the distributions can reduce the separation windows. During the read process, the likelihood of false classification due to occasional distribution overlap raises. Embodiments may therefore make use of soft values rather than digital respectively binary classification of output signals of sense amplifiers, which may be used as an input for ECC.

By means of wear leveling, cells of a memory cell array may homogeneously have the same count of erases. Decision levels may be globally adapted by means of hard coded algorithms, to compensate for aging effects. This compensation can be based on experience and prognosis. Embodiments may globally adapt the decision levels after read failure by means of systematic variations of this decision level and storage of the resulting level. However, cell degradation may be inhomogeneous due to read disturbance. Embodiments may carry out local adaption as well.

Figure 3B:
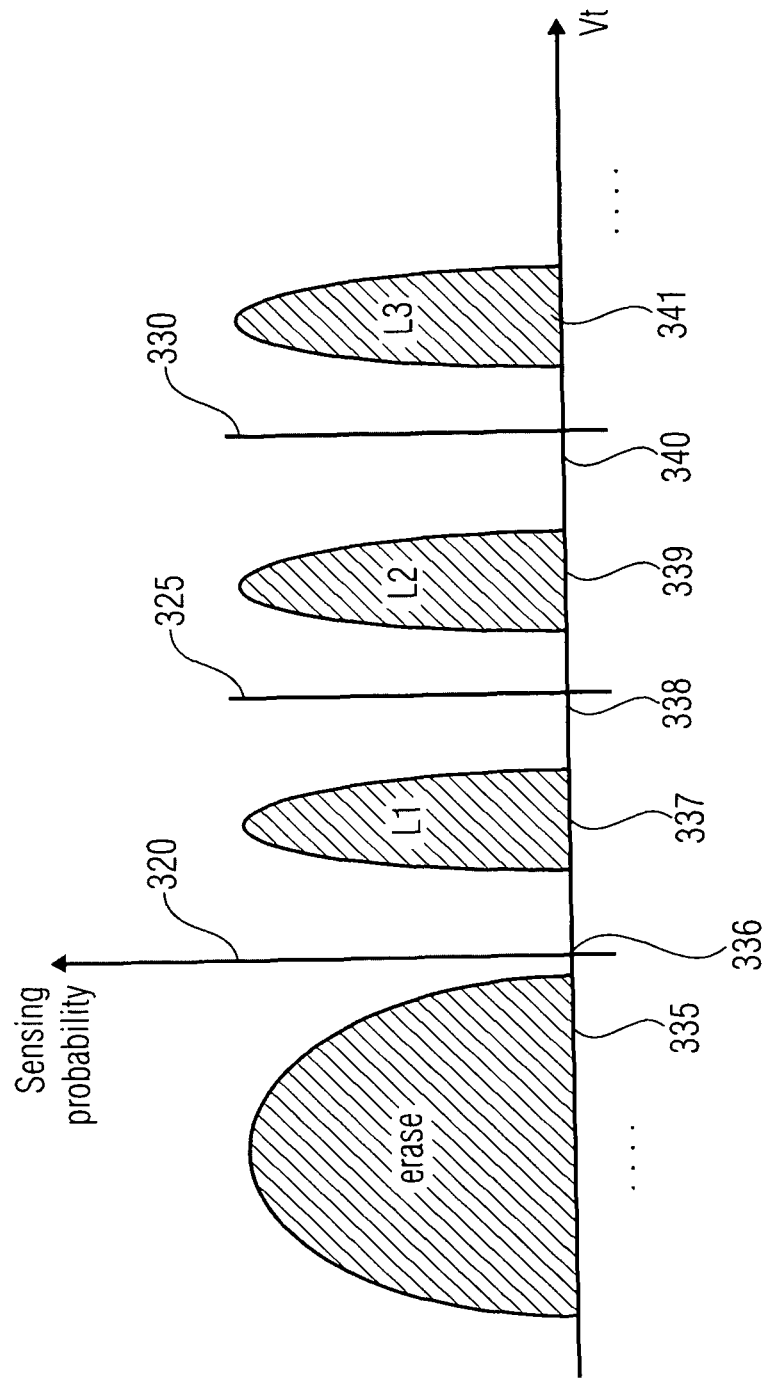
FIG. 3b shows a sensing example of an embodiment.

FIG. 3b illustrates a sensing example of an embodiment. FIG. 3b shows again a viewgraph with a bit line voltage $V_t$ on the abscissa and a sensing probability or PDF on the ordinate. Moreover, FIG. 3b shows four mean values with error distributions as well as binary decision levels 320, 325 and 330. Embodiments may increase the number of decision levels above a minimum requirement for a digital classification. This is indicated in FIG. 3b by the decision levels 335-341. In some embodiments these decision levels may be fixed over lifetime. As indicated by FIG. 3b, embodiments can enable numerical decisions rather than binary decisions. Mapping the numerical values 335-341 to a level of membership probability to a corresponding distribution around a mean value, allows to consider soft decision values for ECC input.

Embodiments may carry out sensing of the bit line level with a granularity, which is finer than a write level granularity. This can be seen from FIG. 3b having more bit line levels than states within the memory cells. Mapping of the sensing results into non-binary code words, for example, non-binary vectors, enables feeding an ECC with the obtained vector of soft values. Moreover, embodiments may subdivide a memory array in concurrently working sub arrays. Embodiments may avoid a misclassification at hard decision thresholds yielding statistical improvements for the ECC correction probability.

Embodiments can therefore generate and use information on a physical condition of a memory, which is also known as soft information from the field of coding. Soft information can, for example, be created during a read operation and/or be dependent on the read bit, read bytes or read bigger units, may be used in addition to a normal correction ability of the used codes to increase the error correction capability or performance. In embodiments the error correction performance may be increased from a range of, for example, up to approximately 16 bits per 512 bytes to a range of correctable bits of 100 per 512 bytes or more. Embodiments may combine the obtained soft information with, for example, low-density parity-check codes (LDPC=Low-Density Parity-Check) or with Trellis Coding Modulation (TCM=Trellis Coding Modulation). Embodiments may further improve error detection and/or error correction ability of memory systems by combining multiple coding strategies as, for example, inner coding and outer coding of the above mentioned codes. Embodiments are not limited to the above mentioned codes, other codes or combinations with other codes may be used as well.

Figure 4:
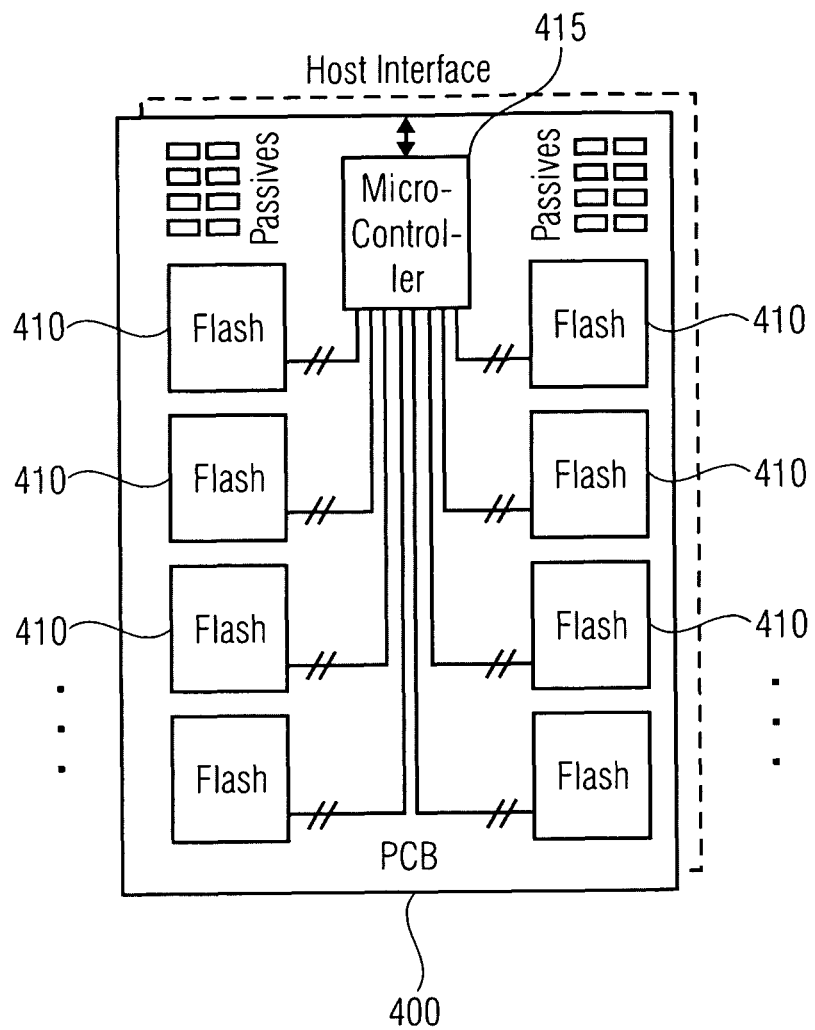
FIG. 4 illustrates an embodiment of a memory system.

Embodiments may be implemented as flash memory systems in which the ECC unit uses soft information. This soft information may be generated within the flash memory mechanism. FIG. 4 shows a general construction of a memory system from a PCB 400 (PCB=Printed Circuit Board). FIG. 4 shows the PCB 400 having multiple flash memory cells 410.

Moreover, the PCB 400 comprises a micro-controller 415, which may comprise a host interface, indicated by the double sided arrow on the top of the micro-controller 415 in FIG. 4.

Figure 5:
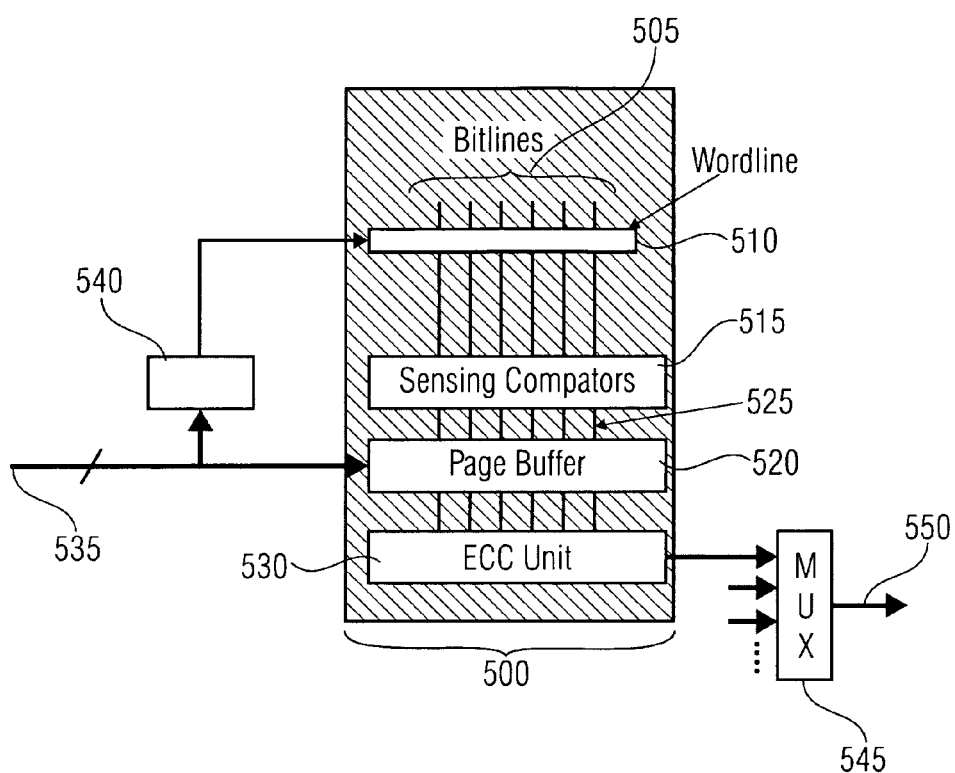
FIG. 5 illustrates another embodiment of a memory system.

FIG. 5 illustrates a more detailed insight in an embodiment of a memory cell. FIG. 5 shows a sub array of memory cells 500. The sub array 500 comprises a number of bit lines 505 and a word line 510. The bit lines 505 are coupled to sensing comparators 515, which can also be termed sense amplifiers. The output of the sensing comparators 515 is coupled to a page buffer 520, which is configured such that the comparator outputs 525 can trigger a latching of data based on a reference index 535. The output of the page buffer 520 is connected to an ECC unit 530. The page buffer 520 further has an input for the reference index 535, which is also input to a reference voltage generator 540. The reference voltage generator 540 determines the reference voltage on the basis of the reference index 535 and provides it to the word line 510. The outcome of the bit lines 505 is then sensed by the sensing comparators 515, and the comparator outputs are latched 525, based on the reference index 535 in the page buffer 520. Based on the output of the page buffer 520 the ECC unit 530 caries out error correction, and provides the corrected codeword to a multiplexor 545, which then multiplexes the output data 550.

Figure 6:
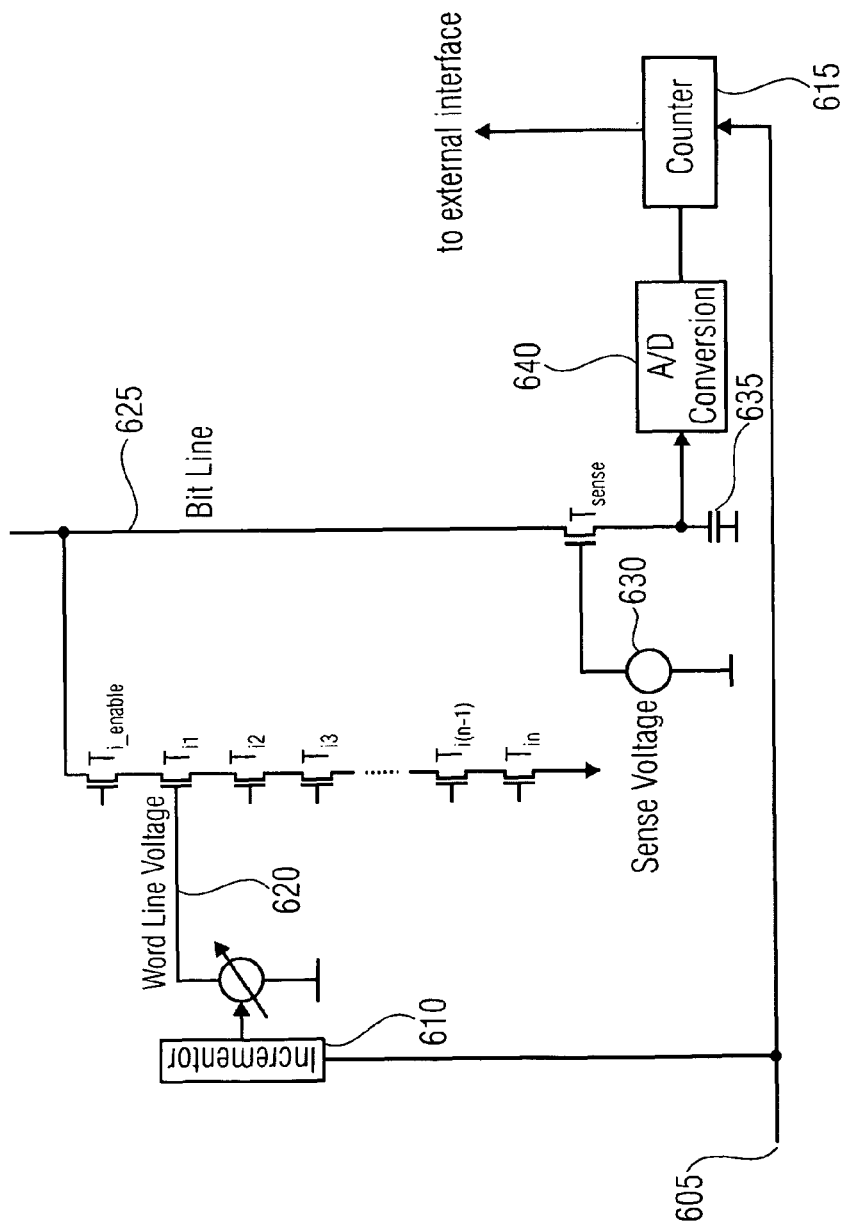
FIG. 6 illustrates another embodiment of a memory system.

Another embodiment is depicted in FIG. 6. FIG. 6 shows a memory system 600. The memory system 600 comprises an input for a clock signal 605, and incrementor 610 and a counter 615. If a clock signal is input into the input 605, the incrementor 610 triggers increments of a word line voltage on a word line 620, and the counter 615 counts the cycles of the clock signal 605. In dependence on the clock signal the incrementor 610 step wise increments the word line voltage on the word line 620, which is connected to the gate of transistor $T_{i1}$. The source of $T_{i1}$ is connected to the drain of transistor $T_{i\_enable}$, which is assumed to be enabled. The train of transistor $T_{i1}$ is coupled to a series of other transistors, which are labeled $T_{i2}, T_{i3}, \ldots T_{i(n-1)}, T_{in}$, which are all assumed to be enabled, therefore $T_{i1}$ determines the bit line voltage on a bit line 625, which runs in parallel to the series of transistors. The bit line 625 is connected to a sensing transistor $T_{sense}$, which is enabled by a voltage supply 630 in order to sense the sense voltage on the bit line 625. The output of the sensing transistor $T_{sense}$ is then input to a capacitor 635 coupled to a reference potential and to an A/D Converter 640. The output of the A/D Converter is then coupled to the counter 615.

After a number of cycles of the clock signal 605, i.e. after a number of increments of the incrementor 610 and the word line voltage on the word line 620 the transistor $T_{i1}$ opens. Therewith, the voltage on the bit line 625 changes, and the sense amplifier or sense transistor $T_{sense}$ detects the data. The output of the data will be A/D converted by the A/D converter 640 and provided to the counter 615, which is also coupled to the clock signal input 605. The counter 615 can therewith determine a number of steps carried out until the output of the A/D converter 640 indicates the data. The number of steps can be taken as indication of how secure the read data are. The output of the counter can be used as soft information. In one simple embodiment only a single bit may be used as soft information as will be described in the following.

Figure 7:
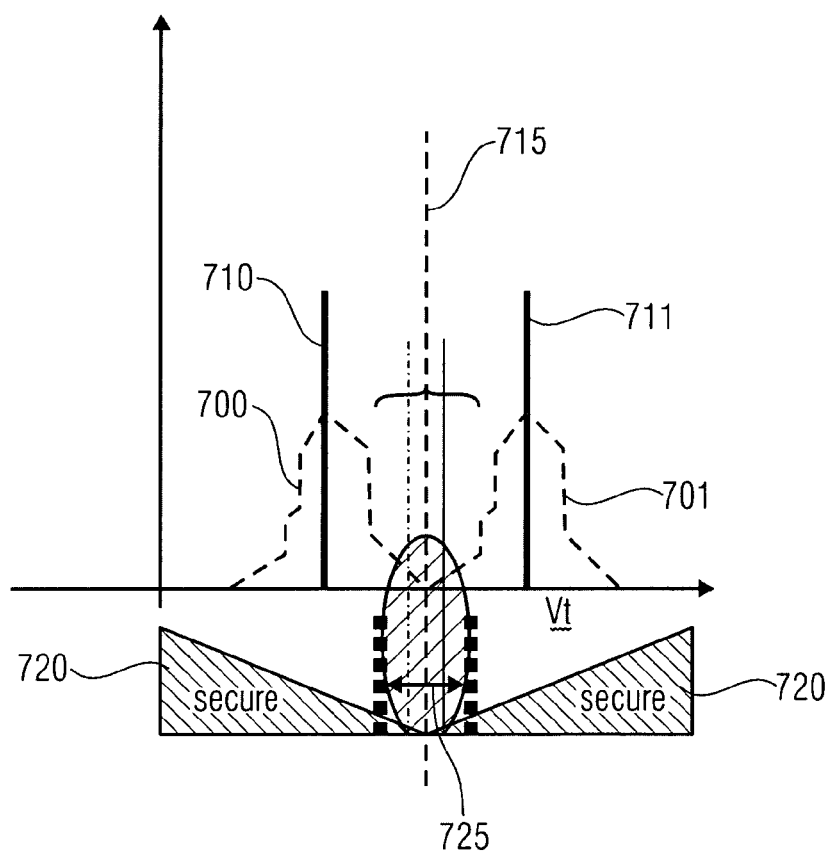
FIG. 7 illustrates a read process of an embodiment.

FIG. 7 illustrates another viewgraph, which will augment to describe an embodiment which uses one bit as soft information. FIG. 7 shows a viewgraph with a bit line voltage $V_t$, which can also be termed threshold voltage, on the abscissa and according probability density functions on the ordinate. FIG. 7 shows two dotted PDFs 700 and 701. The probability density function 700 may correspond to a real probability density function for state "0". The ideal value 710, which is about the mean value of the real distribution 700 is also given in FIG. 7. Correspondingly, the PDF 701 may indicate the real PDF for state "1", and the value 711 may indicate the ideal value.

In FIG. 7 the dotted line 715 around the center indicates the ideal decision threshold if a binary decision was to carry out. If a bit line voltage is sensed, the farther away from the ideal decision threshold 715 a value is, the more secure the value is considered in the present embodiment. This is indicated by the two ramps 720, which indicate that the values farther away from the ideal decision threshold 715 are more secure, i.e., certainty ramps up with growing distance to the center line 715. Consequently, values closer to the ideal decision threshold 715 are less secure, which is indicated by the region 725 in the following also termed "insecure area".

The region 725 can also be considered the region with a lower likelihood for the data being correct, because the threshold 715 may no longer be ideal. Thus, the closer a value of a read-out or a sense result is to the center, i.e., the ideal threshold 715, the more likely it is that the date may be wrong. Therefore, the closeness to the ideal threshold may be used as soft information.

In an embodiment, if the bit line voltage $V_t$ is in the "secure area" 720 the soft information data will be set to "0". If the bit line voltage $V_t$ is in the "insecure area" 725, then the soft information will be set to "1", respectively vise versa. This may be one primitive approach which would require more read cycles to detect the bit line voltage. Embodiments can provide a benefit that a later forward error correction can significantly improve the level of correctness of the data. The above described embodiment may be a primitive approach by using only one bit of soft information for all data obtained from reading the same word line. Of course in other embodiments a finer level can be used, for example, two bits of soft information, i.e., four levels of security.

The embodiment which was described above, i.e., using a multiple read procedure, uses this concept for generation of soft information in order to improve the error correction. The number of read pulses in order to get stable data may serve as soft information. Embodiments may use many different methodologies for generation of such soft information. In the embodiment described above, the number of needed read pulses serves as a quality indication of the reliability of a read-out result, for example, a flash cell, in other words, the number of needed read pulses serves as indication, on how secure the read-out result of a memory cell can be considered. The number of read pulses can be used as information for further processing the error correction part.

In embodiments, once the soft information is generated, it can be preprocessed for the ECC decoder, e.g. by converting a count number into reliability information. Then soft information or reliability information together with a codeword, which may comprise payload data and redundancy data, can be sent to the ECC decoder. Optionally, embodiments may utilize a linear block ECC correction, for example, BCH, after an iterative ECC correction, as, for example, TCM.

Figure 8:
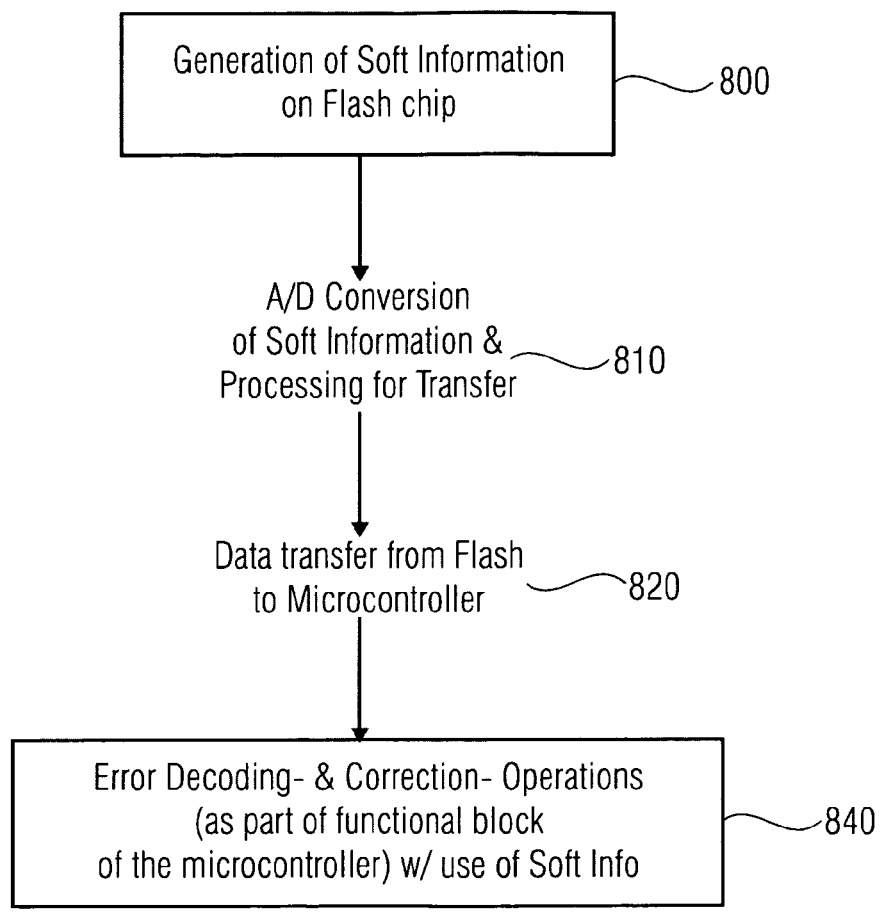
FIG. 8 illustrates a principle process of an embodiment.

FIG. 8. illustrates a flow chart, of an error correction procedure of an embodiment. In step 800 soft information is generated, for example, on a flash memory chip or system. The analog value comprising the soft information generated in step 800 may be A/D-converted in step 810 and further processed. Alternatively, embodiments may carry out a direct transfer of the soft information, for example, by means of analog transfer methodologies as modulation techniques, for example PSK modulation (PSK=Phase Shift Keying).

Following step 810 data may be transferred from the flash memory system or chip to a micro-controller in step 820. This may also be done within an extra data line, for example, in parallel to an 8-bit wide bus. In other embodiments the transfer of soft information may be carried out by using a special interface, for example, a high speed serial interface.

Once the data was transferred, e.g., from the flash memory to the micro-controller in step 820 error decoding and correction can be carried out in a step 830. The error decoding/correction operations of step 830 may be carried out as part of a functional block of the micro-controller with or without the use of the soft information. Optionally, additional benefits may be achieved if several codes are combined, as, for example, a BCH and a LDPC code.

Figure 9:
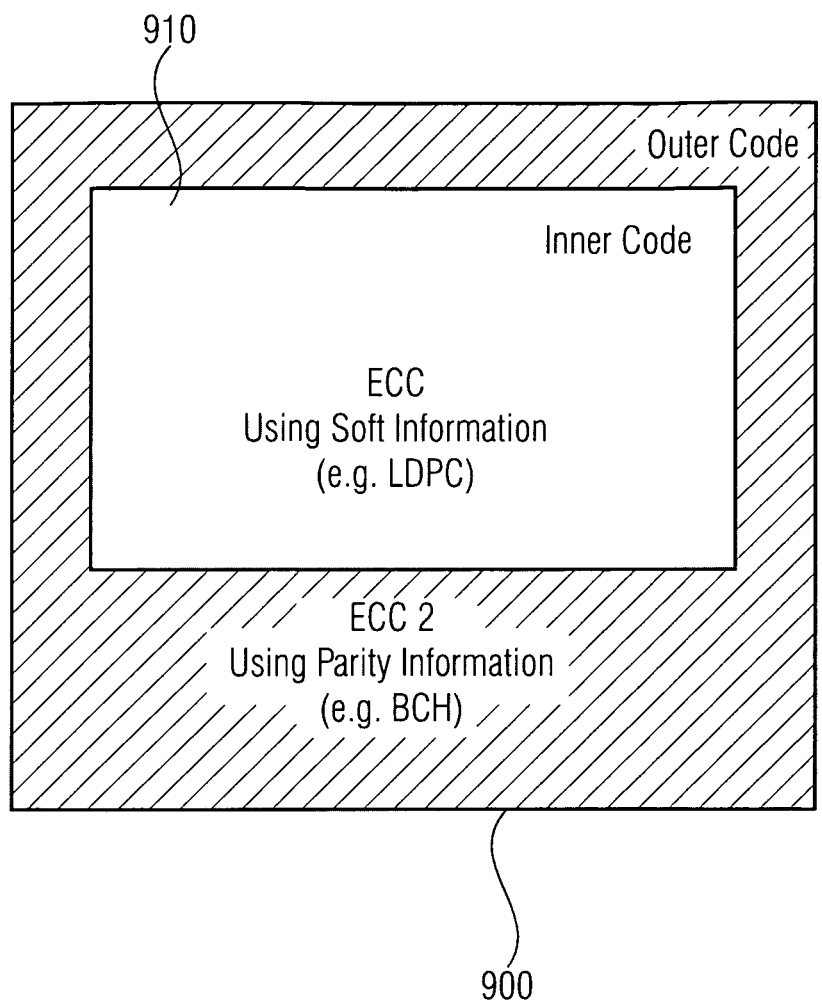
FIG. 9 illustrates a principle of inner and outer coding.

A combination of codes for flash usage with an embodiment, e.g., using LDPC codes or Trellis code modulation, is illustrated in FIG. 9. FIG. 9 shows an outer code 900 and an inner code 910. The outer code 900 may use parity information, as, for example, BCH, while the inner code may use ECC soft information as, for example, LDPC. The use of codes dealing with soft information may not always result in a certain error free result, but in embodiments it may help decrease the number of errors with a certain probability. From a different perspective, for example, a flash memory may be considered as a communication channel, in which such code may act as an improvement for the channel characteristics, for example, resulting in an improved signal-to-noise ratio.

Embodiments may use codes like BCH, Reed-Solomon, Hamming etc., which in comparison guarantee the correction up to a predetermined maximum number of correctable errors as long as a number of errors does not exceed a known error correction ability of the chosen code. In other words, embodiments may use codes, in which the code correction ability is predictable, for as long as an actual number of errors stays below a maximum.

Figure 10:
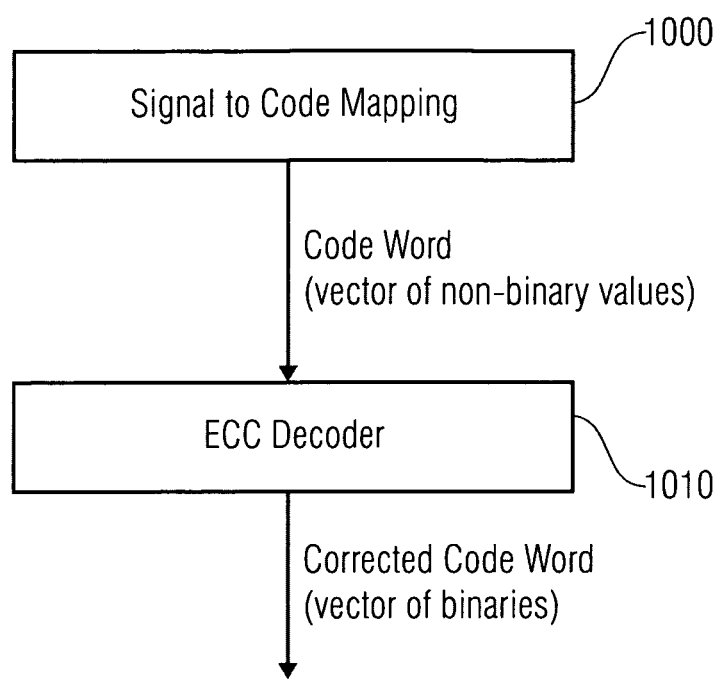
FIG. 10 illustrates a principle of correcting code words.

Embodiments may provide higher reliability, also when combining codes. According to FIG. 9, in one embodiment LDPC may be used as an inner code, considering the generated soft information but not guaranteeing that the result is error free. BCH may be used as an outer code, using the stored parity information with the ability to correct the predetermined number of potentially remaining errors of the inner codes. The overall correction ability of the system comprising an embodiment may improve with respect to conventional systems. A block diagram is shown in FIG. 10 which describes the ECC architecture. First in step 1000 a signal retrieved from the sense amplifiers is mapped to a code word, which may be a vector of non-binary values. The code word or vector of non-binary values can then be provided to an ECC decoder 1010, which outputs a corrected code word, for example, a vector of binaries. Embodiments may be configurable for different mappings for compensation of self degradations. Such embodiments can, for example, enable compensation for aging effects.

Figure 11:
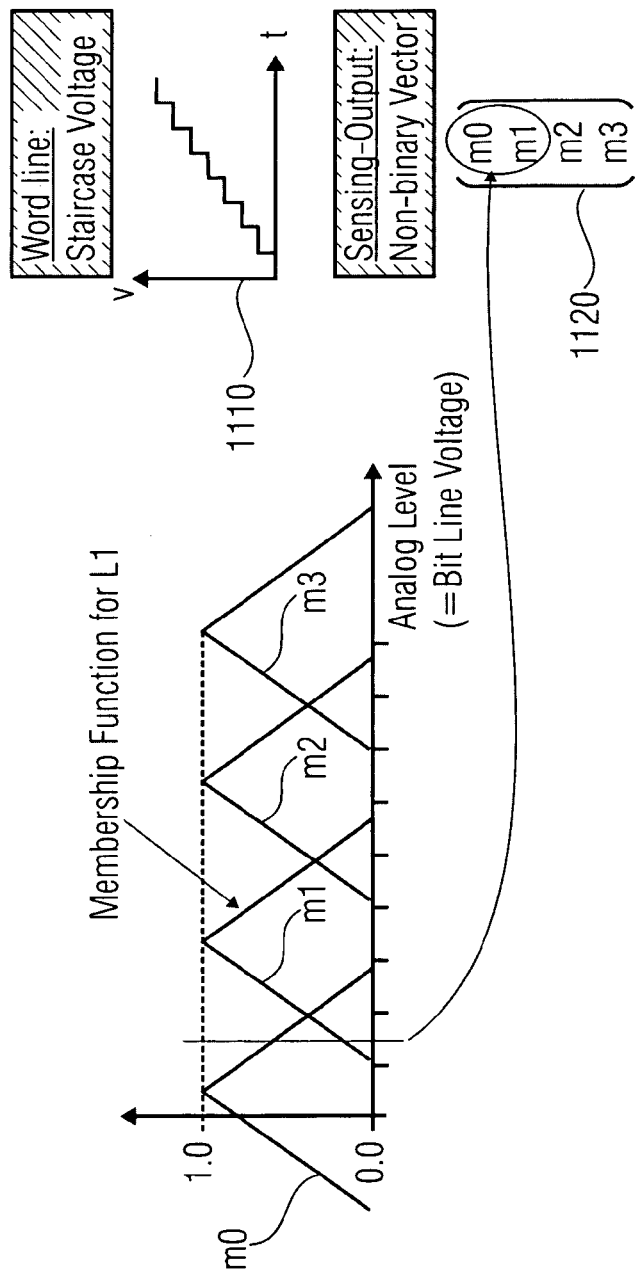
FIG. 11 illustrates a read-out process of an embodiment.

FIG. 11 illustrates another viewgraph showing bit line voltages on the abscissa and PDFs on the ordinate. In FIG. 11, four membership functions M0, M1, M2 and M3 are shown, representing four PDFs of sense results associated with four different memory states. M1 could, for example, correspond to the membership function for L1 as it was introduced above. In the present embodiment it was assumed that the word line voltage, which is depicted in the small viewgraph 1110 on the right hand side of FIG. 11, is step wise increased over time. The embodiment can then determine a sensing output or result by a non-binary vector of 1120. The non-binary vector comprises four non-binary values, in one embodiment representing probabilities that a sensed bit line voltage belongs to a certain membership function.

Figure 12:
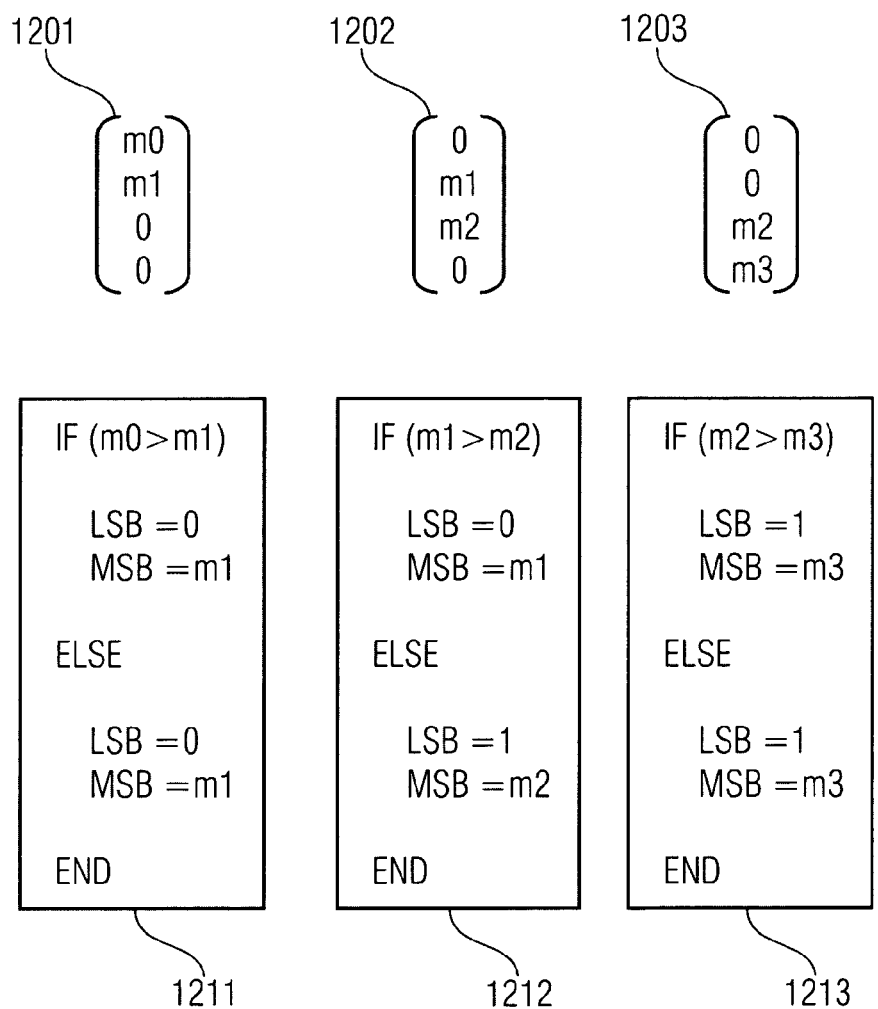
FIG. 12 illustrates a detection of outputs of an embodiment.

FIG. 12 illustrates an embodiment of a signal de-mapping of two pages per word line, comprising a least significant bit (LSB=Least Significant Bit) and a most significant bit (MSB=Most Significant Bit) per memory cell. FIG. 12 shows three non-binary vectors 1201, 1202 and 1203. Underneath each of the three non-binary vectors there are three pseudo codes 1211, 1212 and 1213, indicating how decisions can be made before inputting the output to an ECC decoder. From the pseudo code 1211 it can be seen that if M0 is greater than M1, the LSB is set to 0 and the MSB is set to M1. Note, M1 is a non-binary value. Whenever a non-binary vector, according to 1201 is received, i.e., with the third and fourth component equal to 0, the LSB is set to 0.

In a similar way, the pattern according to the non-binary vector 1203, in which the first two components are 0, yields that the LSB is always set to 1. The more interesting case in this embodiment is the case 1202 where the first and the last component of the non-binary vector are 0. If M1 is greater than M2 than the LSB is set to 0 while the MSB is set to M1. In the other case the LSB is set to 1 and the MSB is set to M2. Therefore, the ECC decoder can use the non-binary value in order to correct errors.

Some embodiments may make effective use of memory space for storage of user data and not for storage of parity data, which would decrease the storage amount of user data. Some systems may dimension the size for the parity to the minimum size really needed, yielding a high error ratio, whereas an embodiment can may enable a lower error ratio.

Figure 13A:
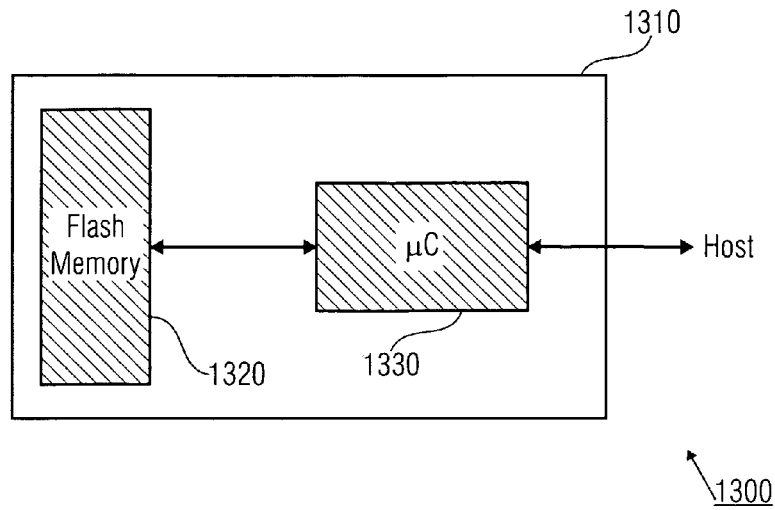
FIG. 13a shows a memory system.

Embodiments may be implemented in the following memory systems or memory modules, which can be used in almost every application utilizing digital data. Memory systems are used to store or buffer digital data, where multiple different memory technologies, as, for example, flash memories are known. FIG. 13a shows a memory system, which may exemplify a memory system using a flash memory. As an example in FIG. 13a it is assumed that a memory system is implemented on an SD or an SSD card 1310 (SD=Secure Digital, SSD=Solid State Drive or Disc). On the SD or SSD 1310 there is a flash memory 1320 coupled to a micro-controller 1330, where the coupling is indicated with double sided arrows in between. The double sided arrow on the right hand side of the micro-controller 1330 indicates, that the micro-controller 1330 may communicate with an external host. The memory system 1300, here a flash system, basically comprises a storage medium, here the flash memory 1320, and a controller functionally, here the micro-controller 1330. The controller functionality may be integrated on the memory die or as an extra component in the system, as it is shown in FIG. 13a.

Error detection and error correction functionality can be integrated in a memory system 1300 as part of a component, i.e., either on the memory 1320 or the controller respectively micro-controller 1330 or even on both components. The purpose of an error detection or correction functionality is to eliminate errors, for example due to the above mentioned effects, and keep the functionality of the memory system, respectively to disable not sufficient memory completely.

Embodiments may also use bad block marking methodologies, which can be used in addition and treat permanent appearing errors, for example, by detecting them directly after production. Some embodiments may focus on temporary errors and errors which may appear after production, for example, because of the above mentioned effects, as, e.g. aging effects of the memory cells, which may lead to an increasing number of appearing errors over time.

Figure 13B:
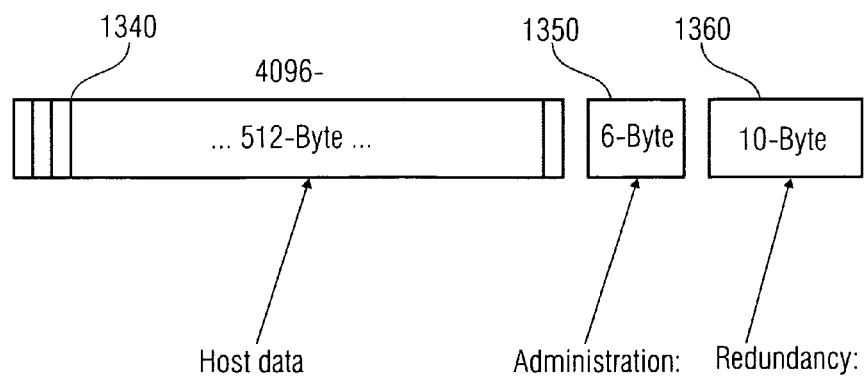
FIG. 13b shows a code illustration.

Additional data bits may be added for administration tasks or for storing created parity data of a used code in the memory. FIG. 13b shows an example of a code, wherein 1340 indicates host data, which is assumed to amount to 4096 bits equaling 512 bytes. Furthermore, FIG. 13b shows another data block 1350 having data for administration purposes and which was assumed to have a size of a 6 byte. Moreover, FIG. 13b shows a data block 1360 of 10 bytes size, which is used for redundancy or parity data. As an example, the shown relations could correspond to a BCH(4167, 4128)-code.

Embodiments may increase a performance of error detection or correction means by utilizing soft information in terms of reliability information for read-out results of memory cells. Embodiments may enable enhanced error correction schemes through provision of said reliability information.

Depending on certain implementation requirements of the inventive methods, the inventive methods may be implemented in hardware or in software. The implementation can be performed using a digital storage medium, in particular a flash memory, a disc, a DVD (DVD=Digital Versatile Disk) or a CD (CD=Compact Disk) having electronically readable control signals stored thereon, which cooperate with a programmable computer system such that the inventive methods are performed. Generally, the present invention is, therefore, a computer program product with a program code stored on a machine readable carrier, the program code being operative for performing the inventive methods when the computer program product runs on a computer. In other words, the inventive methods are, therefore, a computer program having a program code for performing a least one of the inventive methods when the computer program runs on a computer.

What is claimed is:

1. A memory system comprising:
    a plurality of memory cells for storing payload data and redundancy data;
    a read-out circuit configured to read-out a status of the plurality of memory cells, the read-out status comprising payload data, redundancy data and associated reliability information; and
    a data processor configured to derive the payload data from the read-out status using the reliability information;
    wherein the read-out circuit comprises a plurality of sense amplifiers configured to sense memory cells and wherein the read-out circuit is configured to read-out a status of a memory cell by a comparison of an output of a sense amplifier to a threshold;
    wherein the read-out circuit is configured to sequentially change a word-line voltage according to a predetermined manner and wherein the read-out circuit is configured to read-out a status of a memory cell by determining an output of the sense amplifier dependent on the word-line voltage at a time being dependent on the comparison; and
    wherein the predetermined manner is based on an age of the memory cell.

2. A memory system comprising:
    a plurality of memory cells for storing payload data and redundancy data;
    a read-out circuit configured to read-out a status of the plurality of memory cells, the read-out status comprising payload data, redundancy data and associated reliability information; and
    a data processor configured to derive the payload data from the read-out status using the reliability information;
    wherein the read-out circuit comprises a plurality of sense amplifiers configured to sense memory cells and wherein the read-out circuit is configured to read-out a status of a memory cell by a comparison of an output of a sense amplifier to a threshold;
    wherein the read-out circuit is configured to sequentially change a word-line voltage according to a predetermined manner and wherein the read-out circuit is configured to read-out a status of a memory cell by determining an output of the sense amplifier dependent on the word-line voltage at a time being dependent on the comparison; and
    wherein the read-out circuit further comprises a counter for counting incremental word-line voltage changes and is configured to determine the reliability information based on the count.

3. A memory system comprising:
    a plurality of memory cells for storing payload data and redundancy data;
    a read-out circuit configured to read-out a status of the plurality of memory cells, the read-out status comprising payload data, redundancy data and associated reliability information; and
    a data processor configured to derive the payload data from the read-out status using the reliability information;
    wherein the read-out circuit comprises a plurality of sense amplifiers configured to sense memory cells and wherein the read-out circuit is configured to read-out a status of a memory cell by a comparison of an output of a sense amplifier to a threshold;
    wherein the read-out circuit is configured to sequentially change a word-line voltage according to a predetermined manner and wherein the read-out circuit is configured to read-out a status of a memory cell by determining an output of the sense amplifier dependent on the word-line voltage at a time being dependent on the comparison; and
    wherein the output of the sense amplifier corresponds to a bit line voltage and the read-out circuit is configured to determine the reliability information dependent on the word line voltage when the bit line voltage reaches the threshold.

* * * * *